(12) United States Patent
Ju

(10) Patent No.: US 9,917,386 B1
(45) Date of Patent: Mar. 13, 2018

(54) ELECTRICAL CONNECTOR

(71) Applicant: LOTES CO., LTD, Keelung (TW)

(72) Inventor: Ted Ju, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/643,678

(22) Filed: Jul. 7, 2017

(30) Foreign Application Priority Data

Nov. 18, 2016 (CN) .......................... 2016 2 1237983
Jan. 20, 2017 (CN) .......................... 2017 2 0072270

(51) Int. Cl.
| | |
|---|---|
| *H01R 12/00* | (2006.01) |
| *H01R 12/71* | (2011.01) |
| *H01R 13/24* | (2006.01) |
| *H01R 4/02* | (2006.01) |
| *H01R 13/40* | (2006.01) |
| *H01R 33/94* | (2006.01) |
| *H01R 33/74* | (2006.01) |

(52) U.S. Cl.
CPC ........... *H01R 12/716* (2013.01); *H01R 4/027* (2013.01); *H01R 9/096* (2013.01); *H01R 13/2442* (2013.01); *H01R 13/40* (2013.01); *H01R 33/74* (2013.01); *H01R 33/94* (2013.01)

(58) Field of Classification Search
CPC .. H01R 12/716; H01R 4/027; H01R 13/2442; H01R 13/40; H01R 33/74; H01R 33/94
USPC ...................... 439/700, 66, 71, 72
See application file for complete search history.

(56) References Cited

U.S. PATENT DOCUMENTS

| | | | | | |
|---|---|---|---|---|---|
| 6,019,611 | A | * | 2/2000 | McHugh | ............ H01R 13/2435 439/515 |
| 6,179,624 | B1 | * | 1/2001 | McHugh | .............. H05K 7/1069 439/66 |
| 6,731,516 | B1 | * | 5/2004 | Ma | .......................... H01R 12/57 361/785 |
| 7,097,463 | B2 | * | 8/2006 | Hsiao | ..................... H01R 12/57 439/140 |
| 7,347,749 | B1 | * | 3/2008 | Ju | .......................... H01R 12/52 439/864 |
| 9,130,321 | B2 | * | 9/2015 | Chang | .................. H01R 12/716 |

(Continued)

FOREIGN PATENT DOCUMENTS

CN 201303090 Y 9/2009

*Primary Examiner* — Tho D Ta
*Assistant Examiner* — Travis Chambers
(74) *Attorney, Agent, or Firm* — Locke Lord LLP; Tim Tingkang Xia, Esq.

(57) ABSTRACT

An electrical connector for electrically connecting a chip module to a circuit board includes an insulating body and multiple terminals. The insulating body has multiple receiving slots vertically running through the insulating body, and each receiving slot has a stopping portion. The terminals are respectively received in the receiving slots. Each terminal has a contact portion for urging upward the chip module. Each terminal has a soldering surface and a positioning surface that are separated. The soldering surface is soldered through a solder. The solder has bottom surface soldered downward to the circuit board. The positioning surface is positioned below the stopping portion to limit upward movement of the terminal or the positioning surface is positioned above the stopping portion to limit downward movement of the terminal. A height of the positioning surface is between the soldering surface and the bottom surface.

20 Claims, 17 Drawing Sheets

(56) References Cited

U.S. PATENT DOCUMENTS

| | | | | |
|---|---|---|---|---|
| 2004/0077190 A1* | 4/2004 | Huang | ............... | H01R 13/2442 |
| | | | | 439/66 |
| 2005/0037637 A1* | 2/2005 | Walkup | .............. | H01R 13/2442 |
| | | | | 439/66 |
| 2005/0124198 A1* | 6/2005 | Ma | ......................... | H01R 13/41 |
| | | | | 439/331 |
| 2007/0128917 A1* | 6/2007 | Ho | ....................... | H05K 7/1053 |
| | | | | 439/331 |
| 2007/0249240 A1* | 10/2007 | Chiang | ............... | H05K 3/3426 |
| | | | | 439/850 |

\* cited by examiner

US 9,917,386 B1

ELECTRICAL CONNECTOR

CROSS-REFERENCE TO RELATED APPLICATIONS

This non-provisional application claims priority to and benefit of, under 35 U.S.C. § 119(a), Patent Application No. 201621237983.1 filed in P.R. China on Nov. 18, 2016, the entire content of which is hereby incorporated by reference.

FIELD OF THE INVENTION

The present invention relates to an electrical connector, and more particularly to an electrical connector which electrically connects a chip module to a circuit board.

BACKGROUND OF THE INVENTION

An electrical connector, disclosed in Chinese Patent Application No. 200820302546.2, is configured to electrically connect a chip module to a circuit board. The electrical connector includes an insulating body provided with multiple terminal slots and multiple terminals correspondingly received in the terminal slots. Each terminal has a first main body portion, a second main body portion bending and extending from one side of the first main body portion, an elastic portion bending and extending upward from a top end of the first main body portion, a connecting portion extending downward from the first main body portion, and a soldering portion connected with the connecting portion. Barbs are arranged on two sides of each of the second main body portions to fix the terminal in the corresponding terminal slots. Each of the soldering portions is soldered to the circuit board through a solder ball. However, bottom surfaces of the soldering portions are lower than the second main body portions, so that overall heights of the terminals are relatively large, and an ultrathin development trend of electrical connectors cannot be met.

Therefore, a heretofore unaddressed need exists in the art to address the aforementioned deficiencies and inadequacies.

SUMMARY OF THE INVENTION

In one aspect, the present invention relates to an electrical connector that can reduce heights of terminals and meet an ultrathin development trend of electrical connectors.

In certain embodiments, an electrical connector is configured to electrically connect a chip module to a circuit board. The electrical connector includes an insulating body for sustaining the chip module and multiple terminals received in the insulating body. The insulating body has multiple receiving slots running through the insulating body vertically, and each receiving slot is provided with a stopping portion. The terminals are respectively received in the receiving slots. Each terminal has a contact portion configured to contact with the chip module. Each terminal is provided with a soldering surface and a positioning surface that are separated. The soldering surface is soldered with solder. The solder is provided with a bottom surface that is soldered downward to the circuit board. The positioning surface is positioned below the stopping portion to limit upward movement of the terminal or the positioning surface is positioned above the stopping portion to limit downward movement of the terminal. A height of the positioning surface is between the soldering surface and the bottom surface.

In certain embodiments, each terminal includes a base. An elastic arm is formed by bending and extending upward from a top end of the base, and the elastic arm is connected with the contact portion. A soldering portion is formed by extending from a bottom end of the base, and the soldering surface is a bottom surface of the soldering portion. A positioning arm is formed by extending from one side of the base, and the positioning arm is received in the receiving slot. A barb is formed at a tail end of the positioning arm. The positioning surface is formed at a top surface of the barb, and is positioned below the stopping portion.

In certain embodiments, each of the positioning arm and the base of each terminal has a plate shape, and are positioned in the same vertical plane.

In certain embodiments, a protruding portion protrudes horizontally from one side of each positioning arm in a direction away from the base, a limiting portion protrudes horizontally from one side of each base in a direction away from the positioning arm, and the limiting portion and the protruding portion are positioned in the same vertical plane.

In certain embodiments, a limiting portion protrudes horizontally from one side of each base in the direction away from the positioning arm. Each receiving slot is provided with a limiting slot. The limiting slot has a lower surface, a first side surface and a second side surface connected with the lower surface and opposite to each other, and a third side surface connected with the first side surface and the second side surface. The limiting portion is limited in the limiting slot.

In certain embodiments, the positioning arm is connected with the base through a connecting portion, and a height of the connecting portion is between an upper edge and a lower edge of the limiting portion.

In certain embodiments, the soldering portion is formed by perpendicular bending from the base and extending. The elastic arm includes a first arm bending from the top end of the base and extending toward a direction away from the vertical plane where the base is positioned, and a second arm returning from the first arm and bending and extending across the vertical plane where the base is positioned. The first arm and the soldering portion are positioned on the same side of the vertical plane where the base is positioned. The second arm is connected with the contact portion.

In certain embodiments, the soldering portion is parallel to the first arm.

In certain embodiments, a limiting surface is arranged at each receiving slot to limit upward movement of the solder, and the stopping portion is flush with the limiting surface.

In certain embodiments, a protruding block is arranged on each of two opposite sides of each receiving slot on an upper surface of the insulating body in the protrusion manner, and is configured to support the chip module. A reserved space is formed between every two adjacent protruding blocks. The terminals in every two adjacent rows are staggered. The contact portions of the terminals in the rear rows are positioned over the reserved spaces corresponding to the front rows.

In another aspect, the present invention relates to an electrical connector for electrically connecting a chip module to a circuit board. In certain embodiments, an electrical connector includes an insulating body for sustaining the chip module and multiple terminals. The insulating body is provided with multiple receiving slots running through the insulating body. Each receiving slot is provided with a stopping portion. The terminals are correspondingly received in the receiving slots, respectively. Each terminal has a contact portion configured to contact upward the chip module, a soldering portion soldered downward to the circuit board through solder, and a barb separated from the soldering portion. A bottom surface of the soldering portion is higher than a top surface of the barb, and the barb is stopped below the stopping portion.

In certain embodiments, each terminal has a base, an elastic arm bending and extending upward from a top end of the base and connected with the contact portion, the soldering portion extending from a bottom end of the base, and a positioning arm extending from one side of the base. The barb is formed at a tail end of the positioning arm.

In certain embodiments, each of the positioning arm and the base of each terminal has a plate shape, and are positioned in the same vertical plane.

In certain embodiments, a protruding portion protrudes horizontally from one side of each positioning arm in a direction away from the base, and the width of the positioning arm is gradually reduced from top to bottom from the protruding portion to the barb.

In certain embodiments, a protruding portion protrudes horizontally from one side of each positioning arm in a direction away from the base, a limiting portion protrudes horizontally from one side of each base in the direction away from the positioning arm, and the limiting portion and the protruding portion are positioned in the same vertical plane.

In certain embodiments, a limiting portions protrudes horizontally from joint of the bases and the elastic arm.

In certain embodiments, each soldering portion is formed by perpendicular bending from the base and extending. The elastic arm includes a first arm bending from the top end of the base and extending towards a direction away from the vertical plane where the base is positioned, and a second arm returning from the first arm and bending and extending across the vertical plane where the base is positioned. The first arm and the soldering portion are positioned on the same side of the vertical plane where the base is positioned. The second arm is connected with the contact portion.

Compared with the related art, certain embodiments of the present invention have the following beneficial advantages.

The positioning surfaces of the terminals of the electrical connector of the present invention are lower than the soldering surfaces, so that the soldering surfaces are high enough, heights of the terminals are reduced, and an ultra-thin development trend of electrical connectors is met.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1A:
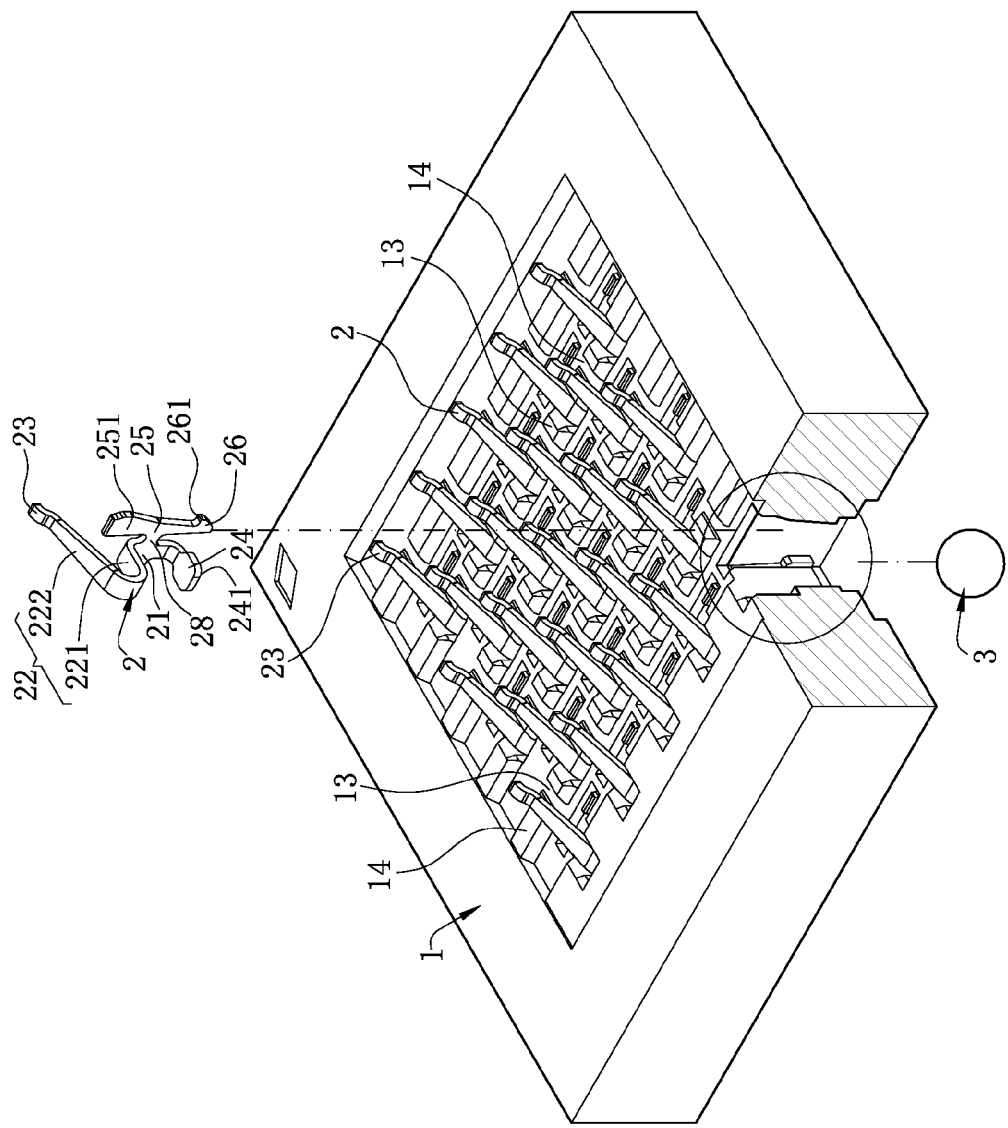
FIG. 1A is a schematic three-dimensional partial sectional view of an electrical connector according to a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1A-15. In accordance with the purposes of this invention, as embodied and broadly described herein, this invention, in one aspect, relates to an electrical connector.

As shown in FIGS. 1A-3, an electrical connector 100 according to a first embodiment of the present invention is a land grid array (LGA) electrical connector 100 for electrically connecting a chip module 4 to a circuit board 5. The electrical connecter 100 includes an insulating body 1 and multiple terminals 2. The insulating body 1 is provided with multiple receiving slots 11 in a penetration manner. The terminals 2 are correspondingly received in the receiving slots 11. The terminals 2 are soldered to the circuit board 5 through solders 3.

Figure 1B:
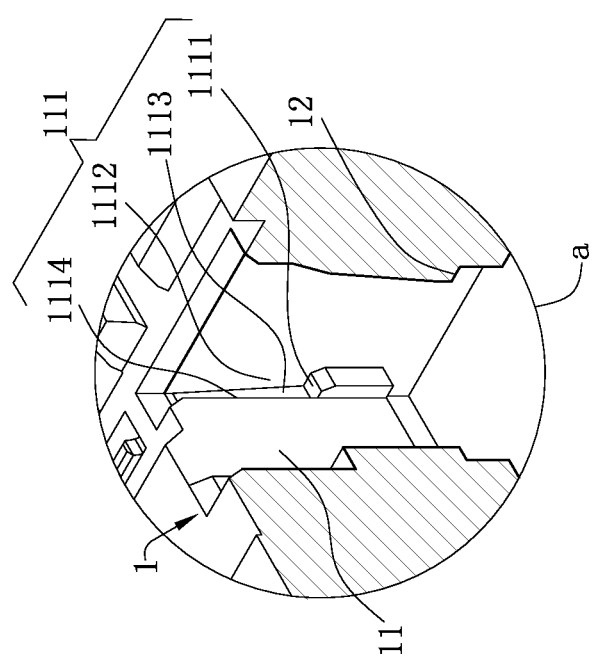
FIG. 1B is an enlarged view of a part that is highlighted by a circle in FIG. 1A.
Figure 2:
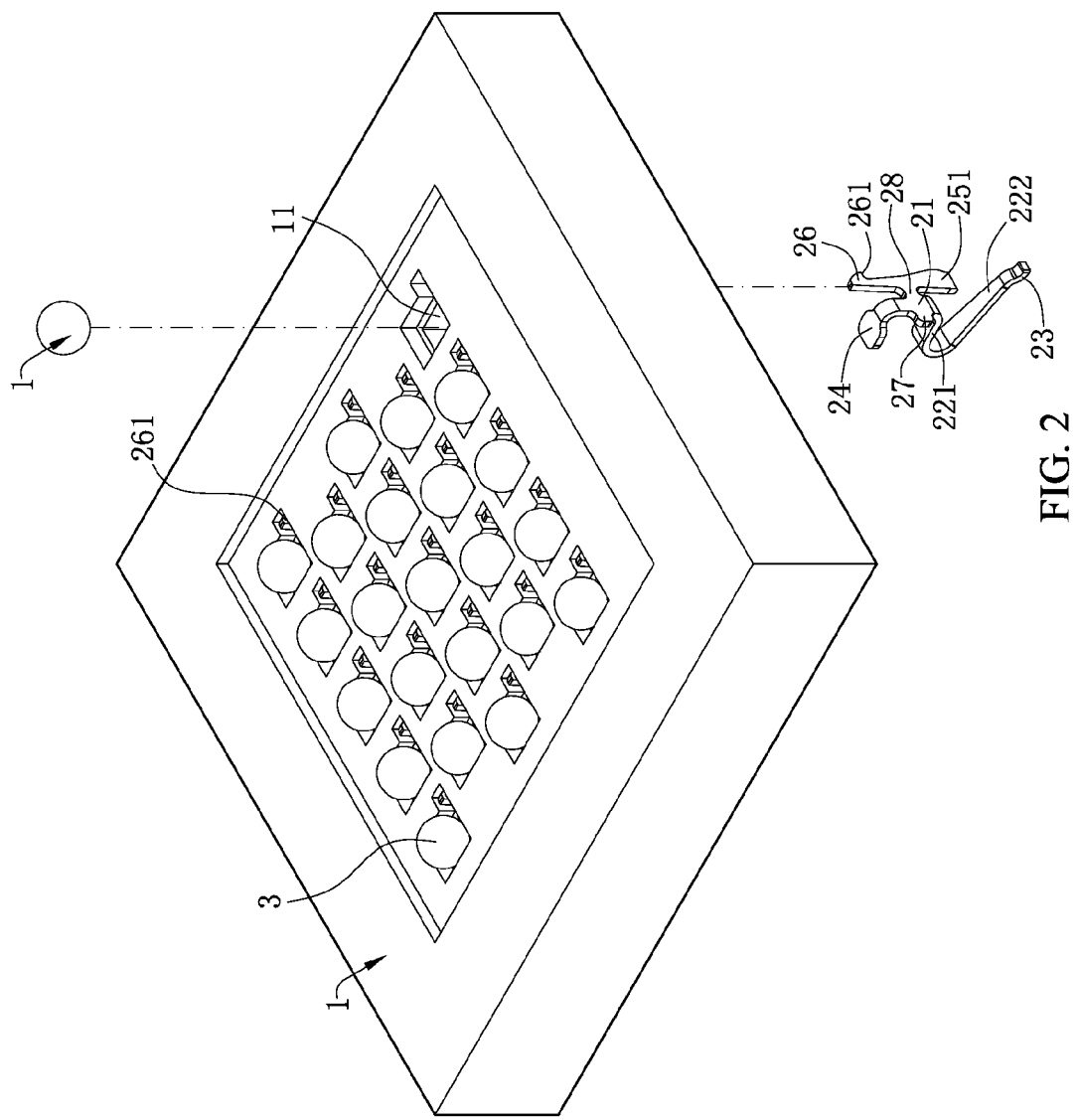
FIG. 2 is a schematic three-dimensional partial exploded view of the electrical connector according to the first embodiment of the present invention.
Figure 3:
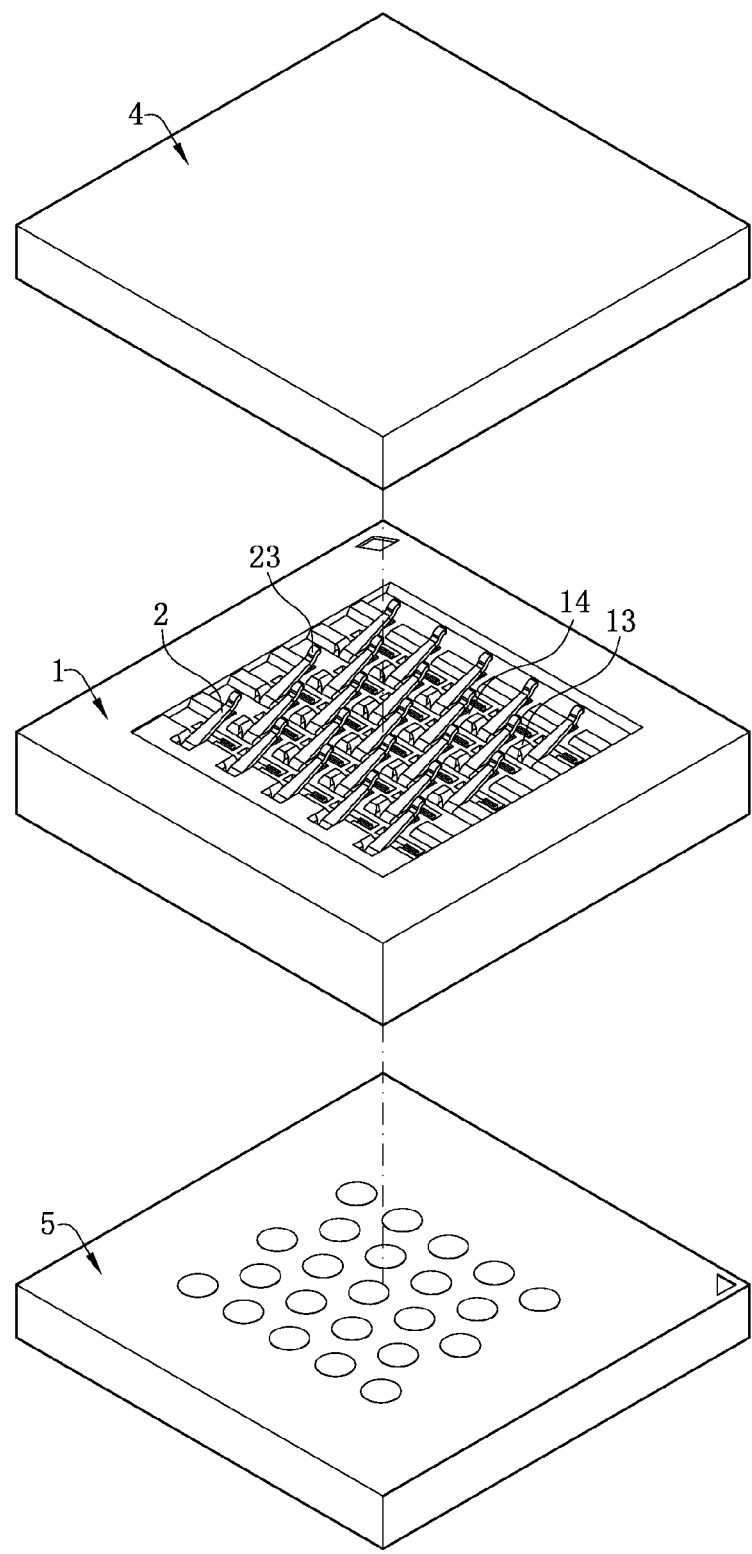
FIG. 3 is a schematic three-dimensional exploded view of the electrical connector, a chip module and a circuit board before assembling according to the first embodiment of the present invention.

As shown in FIG. 1A and FIG. 1B, a protruding block 13 is arranged on each of two opposite sides of each receiving slot 11 on an upper surface of the insulating body 1 in a protrusion manner. The protruding blocks 13 are used to support the chip module 4.

Figure 4A:
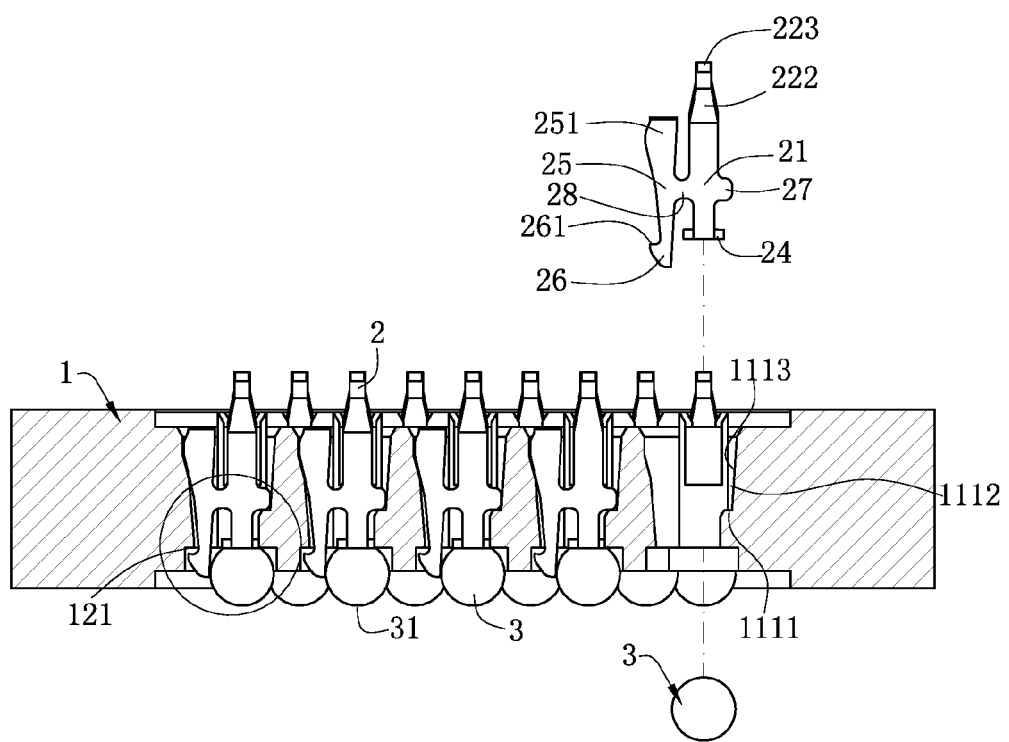
FIG. 4A is a sectional view of the electrical connector according to the first embodiment of the present invention.
Figure 4B:
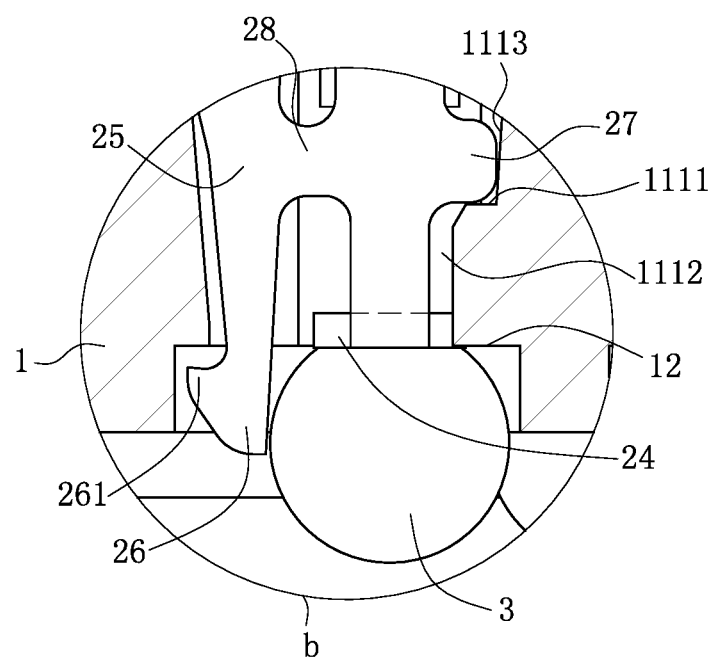
FIG. 4B is an enlarged view of a part that is highlighted by a circle in FIG. 4A.
Figure 5:
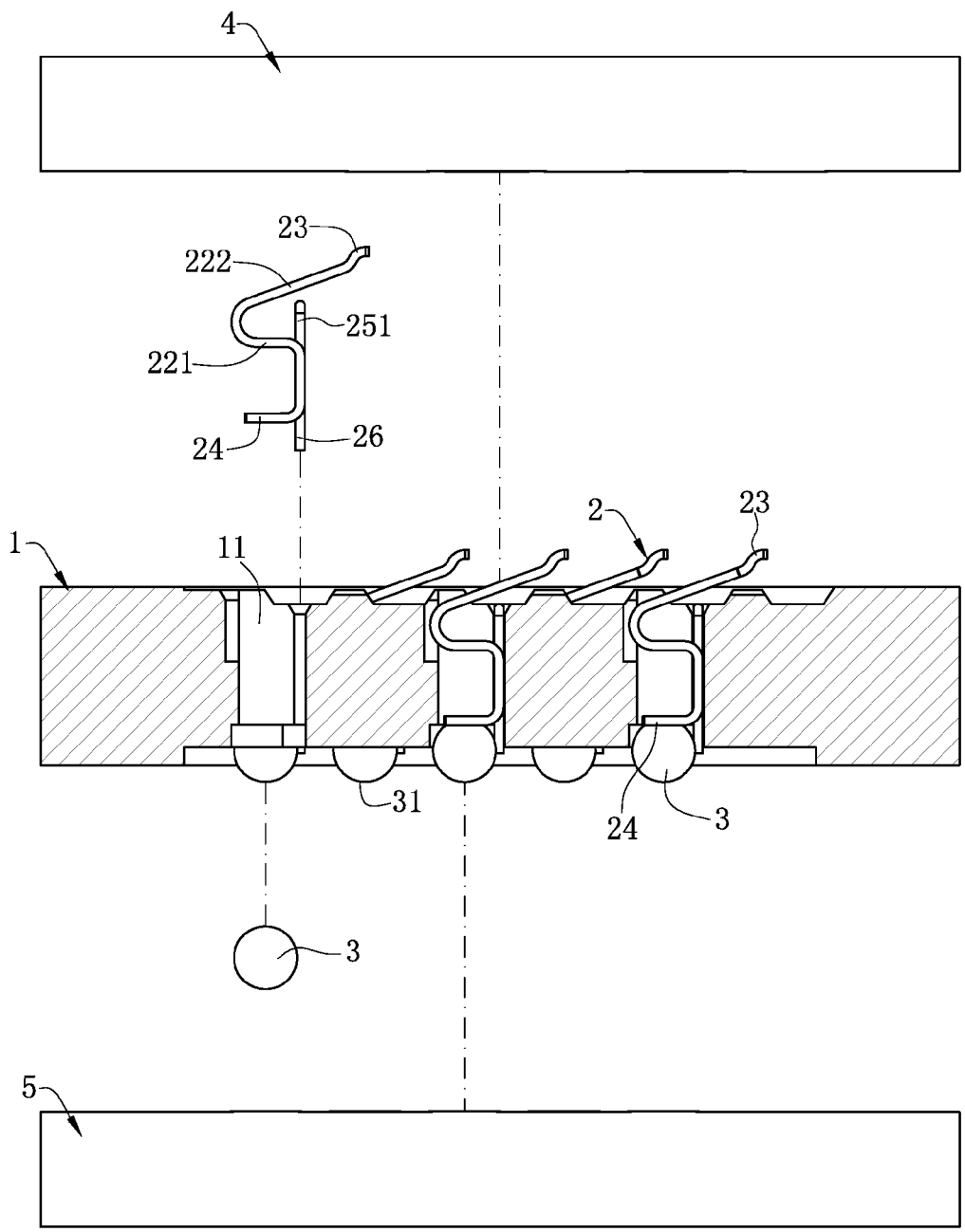
FIG. 5 is a sectional view of the electrical connector, the chip module and the circuit board before assembling according to the first embodiment of the present invention.
Figure 6:
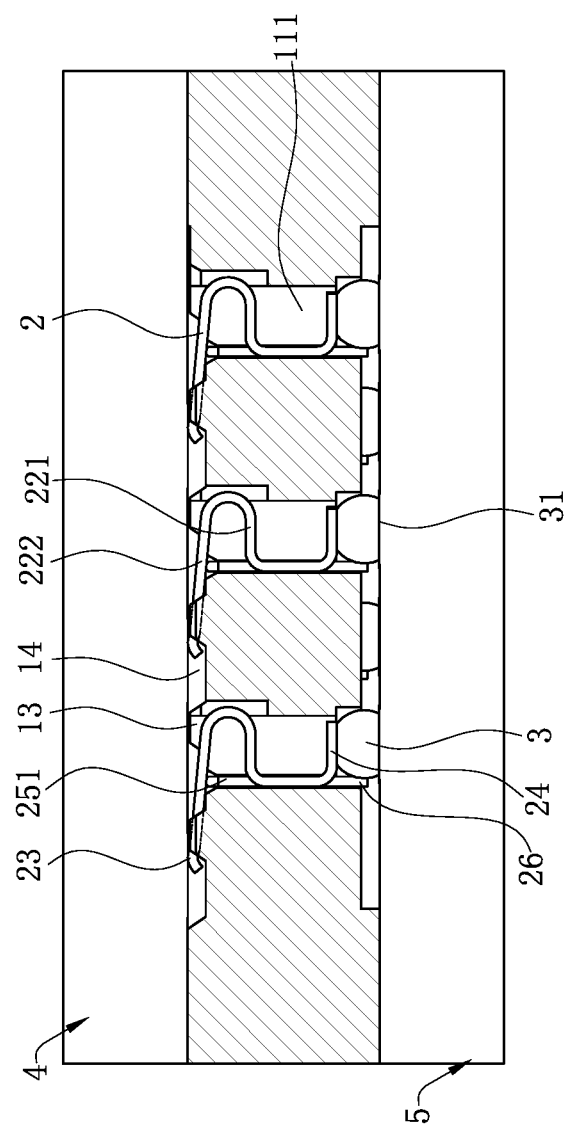
FIG. 6 is a sectional view of the electrical connector, the chip module and the circuit board after assembling according to the first embodiment of the present invention.

A reserved space 14 is formed between every two adjacent protruding blocks 13. As shown in FIG. 1 and FIG. 4, a stopping portion 121 is arranged in each receiving slot 11, and a limiting surface 12 is arranged at the receiving slot 11 to limit upward movement of the solder 3. The stopping portion 121 is flush with the limiting surface 12. Each receiving slot 11 is further provided with a limiting slot 111. The limiting slot 111 has a lower surface 1111, a first side surface 1112 and a second side surface 1113 connected with the lower surface 1111 and opposite to each other, and a third side surface 1114 connected with the first side surface 1112 and the second side surface 1113.

As shown in FIGS. 2-6, each terminal 2 has a base 21 received in the corresponding receiving slot 11. The base 21 is in a shape of a plate. An elastic arm 22 is formed by upward bending and extending from a top end of the base 21. A contact portion 23 is formed by extending from the elastic arm 22. The contact portion 23 is positioned over the reserved space 14. In the embodiment, the elastic arm 22 includes a first arm 221 which is formed by bending from a top end of the base 21 and extending toward a direction away from a vertical plane where the base 21 is positioned, and a second arm 222 which returns from the first arm 221 and bends and extends across the vertical plane where the base 21 is positioned. The second arm 222 is connected with the contact portion 23 to improve elasticity of the contact portion 23 and enable the contact portion 23 to firmly and elastically urge against the chip module 4. In other embodiments, there are no limits made to the formation of the elastic arm 22 as long as the contact portion 23 stably and elastically urges the chip module 4.

A soldering portion 24 is formed by perpendicular bending and extending from a bottom end of each base 21. A bottom surface of the soldering portion 24 forms a soldering surface 241 for being soldered to the solder 3. The solder 3 is received to the corresponding receiving slot 11 to reduce a height of the electrical connector 100. In addition, the soldering portion 24 and the first arm 221 are positioned on the same side of the vertical plane where the base 21 is positioned, and are parallel to each other, so that stability of overall structures of the terminals 2 is ensured. A limiting portion 27 protrudes and extends in a horizontal direction on one side of each base 21. The limiting portion 27 is positioned in the limiting slot 111, and limits movement of the terminal 2 in the receiving slot 11. In certain embodiments, the limiting portion 27 is formed by protruding and extending from a joint of the base 21 and the elastic arm 22, so that an effective distance between the limiting portion 27 and the soldering portion 24 in a vertical direction is prolonged, and a limiting function of the limiting portion 27 is enhanced.

A positioning arm 25 is formed by extending in a direction away from the limiting portion 27 on the other side of each base 21, and the positioning arm 25 is also received in the receiving slot 11. The positioning arm 25 has a plate shape, and is positioned in the same vertical plane with the base 21. The positioning arm 25 is connected with the base 21 through a connecting portion 28. A height of the connecting portion 28 is between an upper edge and a lower edge of the limiting portion 27, so that symmetry and stability of the overall structures of the terminals 2 are enhanced. A barb 26 is formed at a tail end of each positioning arm 25. A top surface of the barb 26 forms a positioning surface 261. The positioning surface 261 is positioned below the stopping portion 121, so that the terminal 2 is prevented from excessively moving upward in the receiving slot 11 during a mounting process of the solder 3, and signal transmission stability is improved. A gap between the positioning surface 261 and the stopping portion 121. Further, a height of each positioning surface 261 is between the soldering surface 241 a lower point 31 of the solder 3, so that not only can it be ensured that the soldering surface 241 is high enough to receive the solder 3 in the receiving slot 11 to reduce the height of the electrical connector 100, but also it can be ensured that the positioning arm 25 has a certain length to improve elasticity of the barb 26, effectively stop the positioning surface 261 at the stopping portion 121, improve retaining power of the receiving slot 11 and improve stability of the terminal 2. In addition, a protruding portion 251 is horizontally arranged on one side of each positioning arm 25 in a direction away from the base 21 in the protrusion manner. The protruding portion 251 is positioned in the same vertical plane with the limiting portion 27, and together with the limiting portion 27, respectively stop two opposite sidewalls of the receiving slot 11, so that the terminal 2 is prevented from excessively swinging leftward and rightward in the receiving slot 11. In the embodiment, the width of each positioning arm 25 is gradually reduced from top to bottom from the protruding portion 251 to the barb 26, so that the elasticity of the barb 26 is further enhanced, the barb 26 can be stopped at the stopping portion 121 better, and assembling of the terminal 2 is facilitated.

Figure 7:
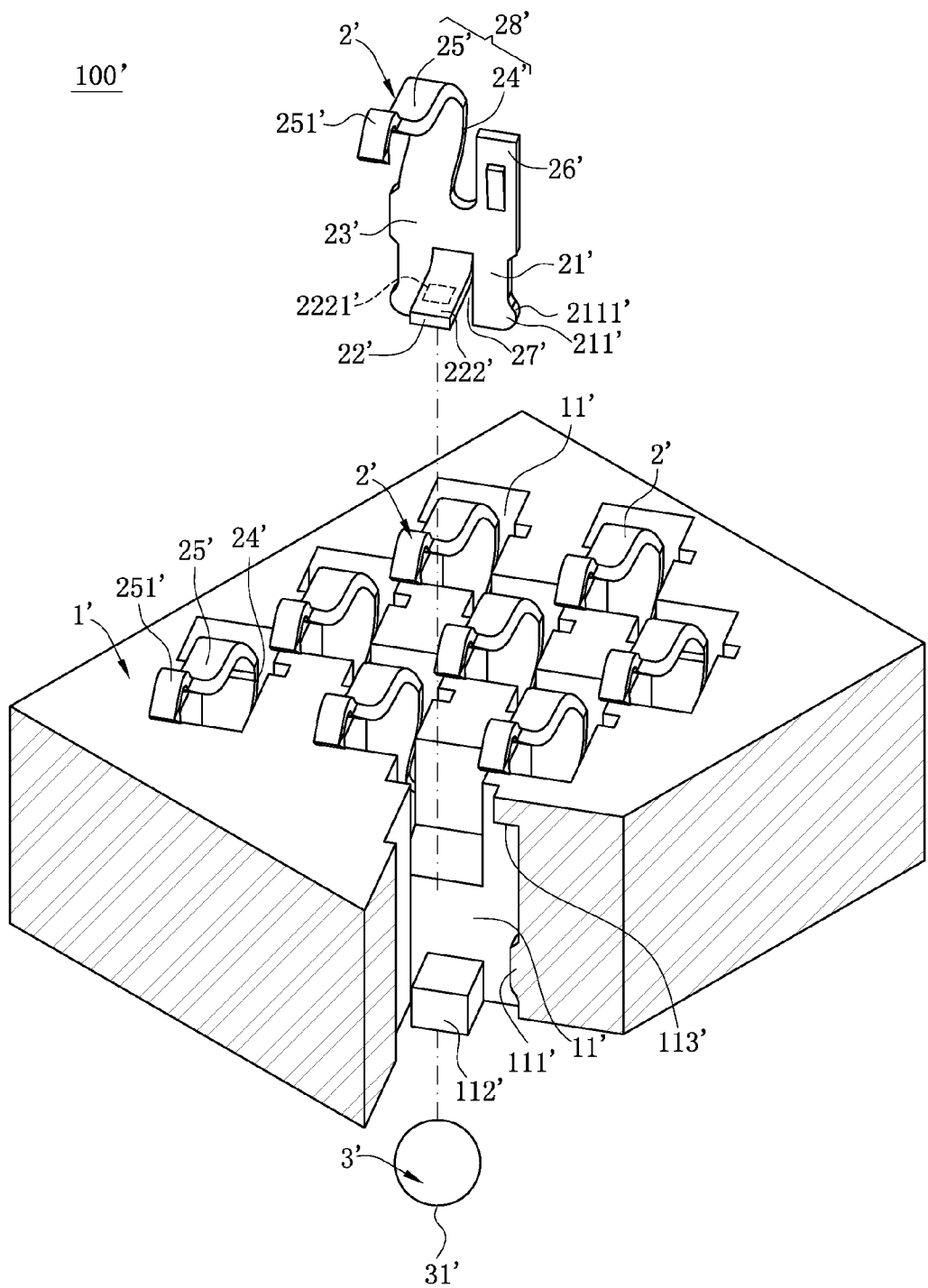
FIG. 7 is a schematic three-dimensional partial exploded view of an electrical connector according to a second embodiment of the present invention.
Figure 9:
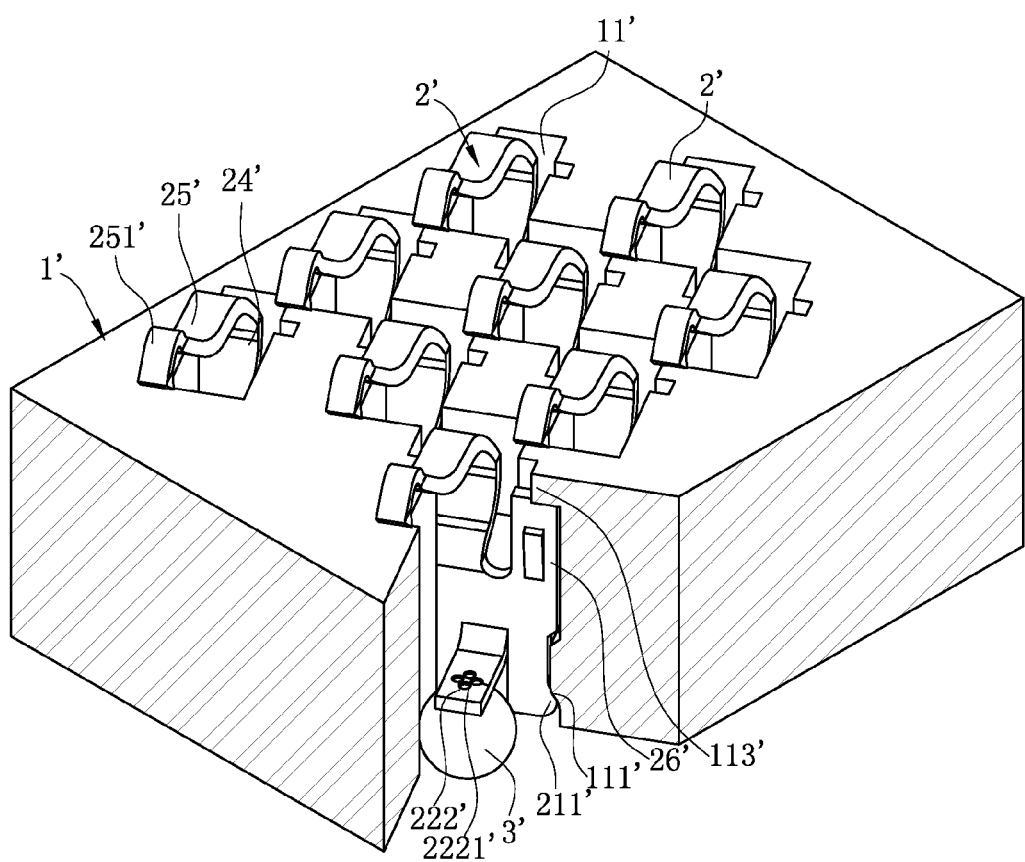
FIG. 9 is a schematic three-dimensional partial assembly view of the electrical connector according the second embodiment of the present invention.
Figure 10:
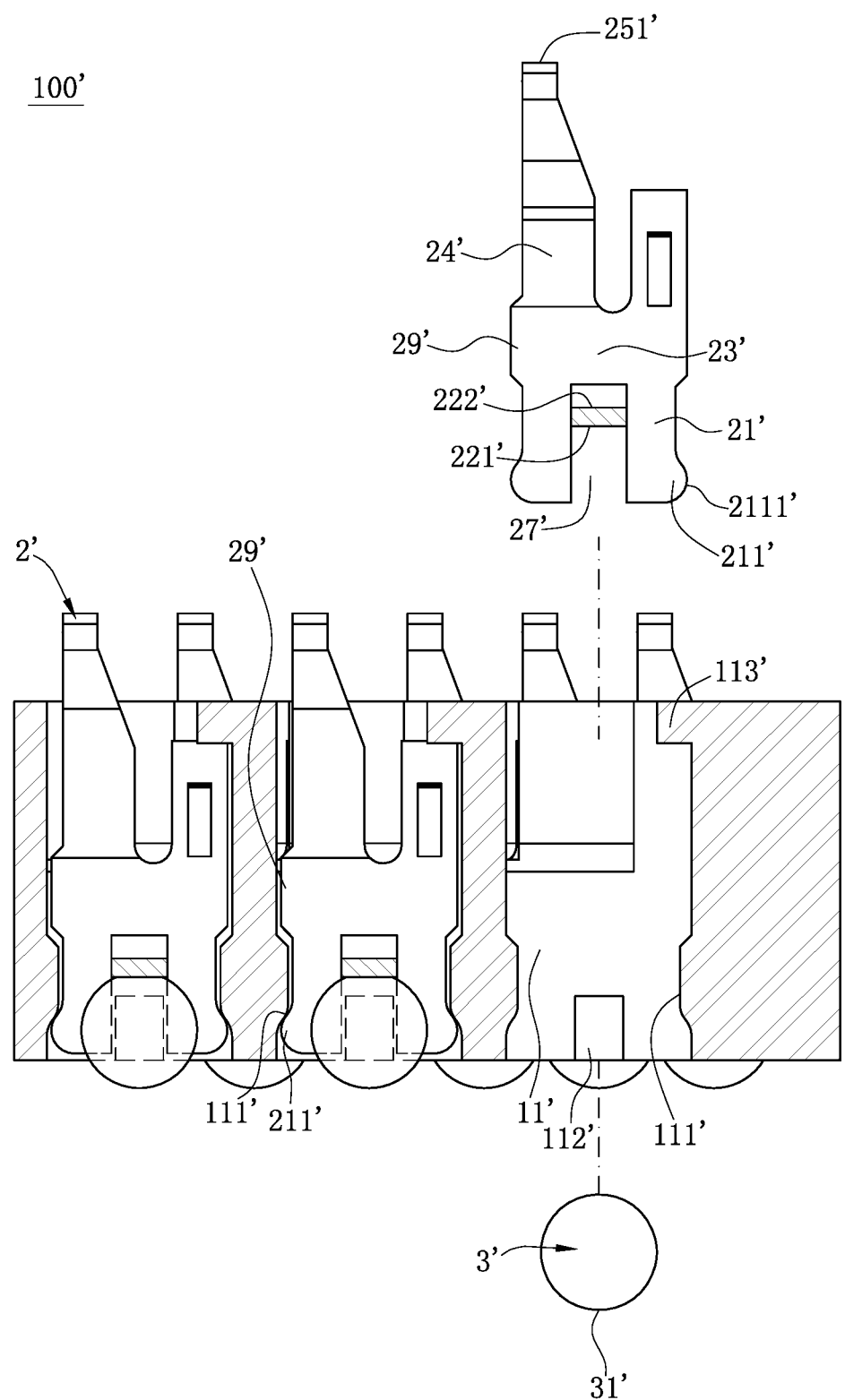
FIG. 10 is a sectional view of the electrical connector according to the second embodiment of the present invention.
Figure 11:
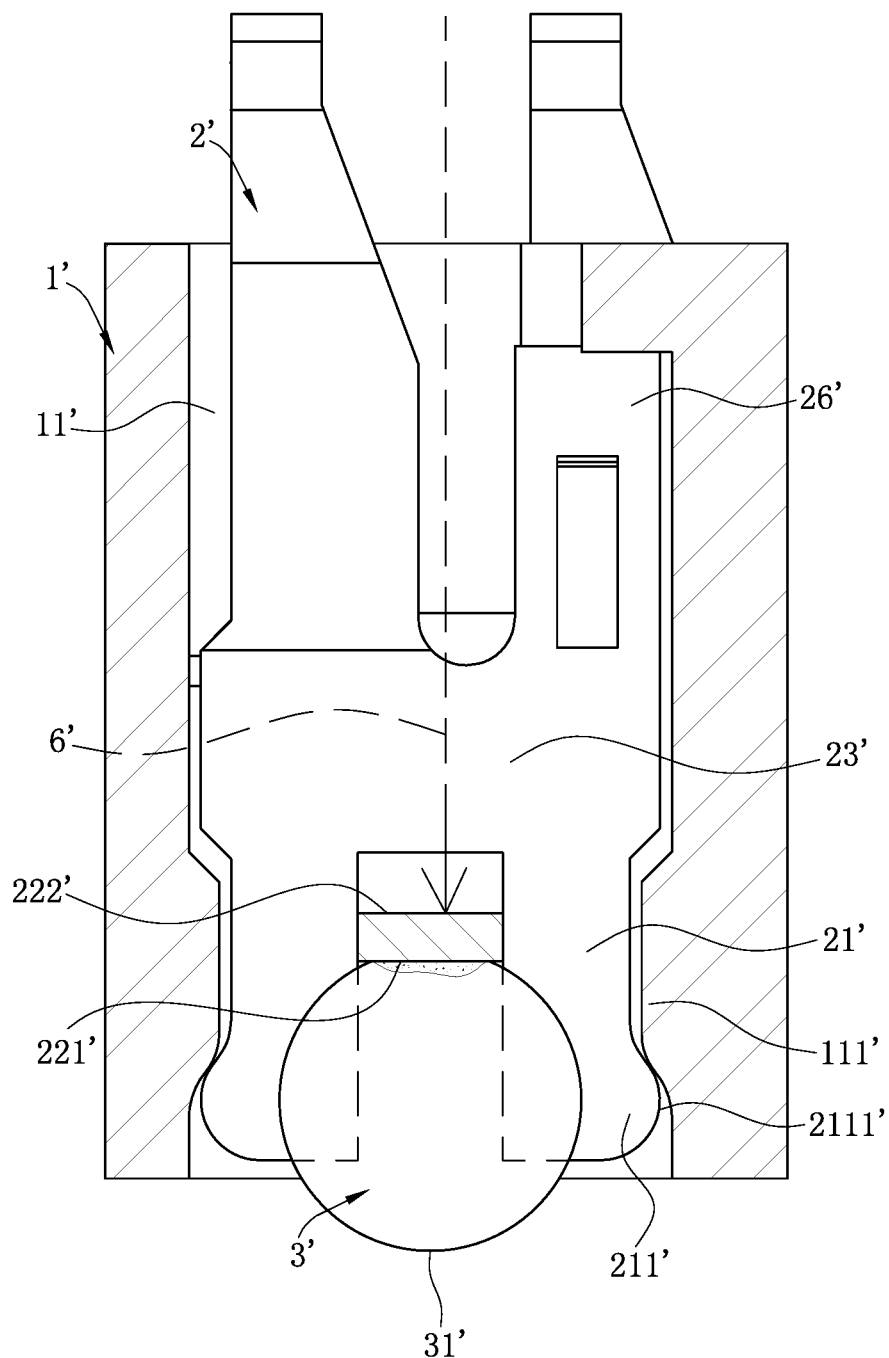
FIG. 11 is a sectional view of the electrical connector according to the second embodiment of the present invention from another angle.
Figure 12:
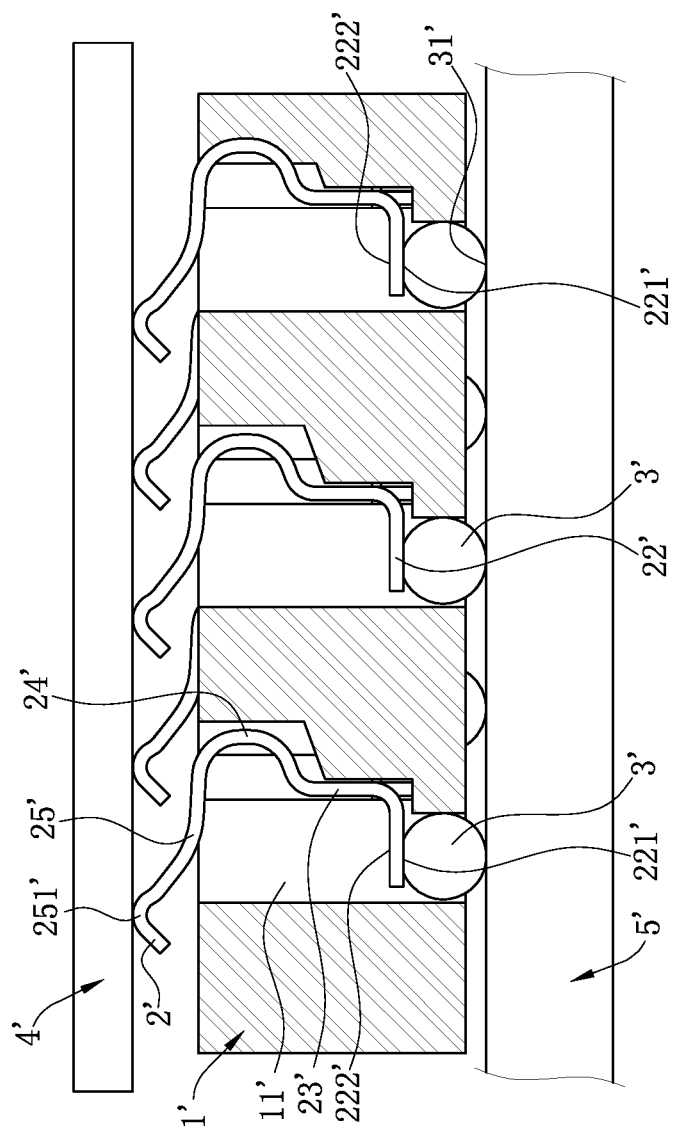
FIG. 12 is a sectional view of the electrical connector, a chip module and a circuit board after assembling according to the second embodiment of the present invention.

FIGS. 7, 9 and 12 show a second embodiment of an electrical connector 100' of the present invention. The electrical connector 100' is configured to electrically connect a chip module 4' to a circuit board 5'. The electrical connector 100' includes an insulating body 1' and multiple terminals 2' received in the insulating body 1'. The terminals 2' are soldered to the circuit board 5' through solder 3'.

Figure 8:
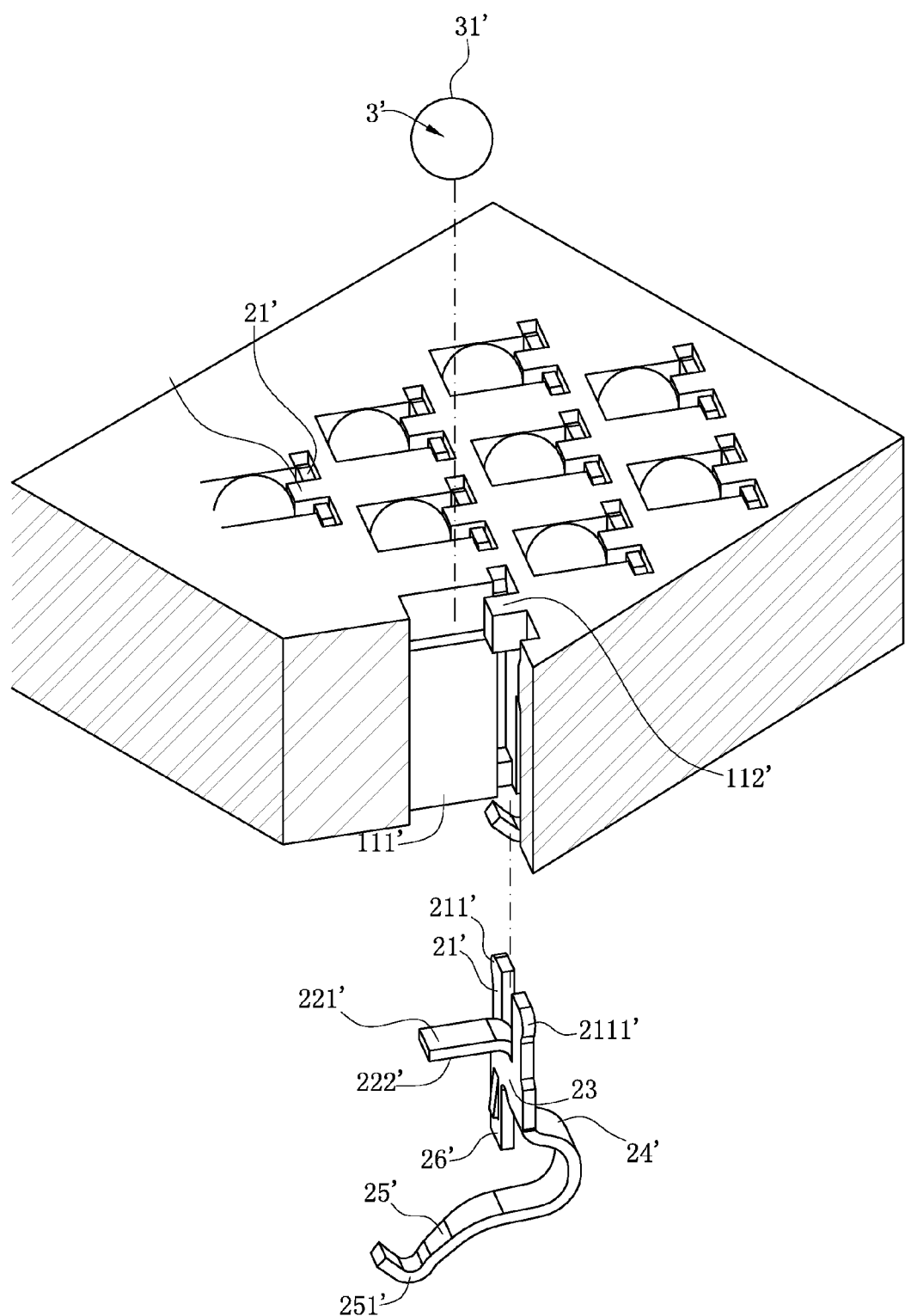
FIG. 8 is a schematic three-dimensional exploded view of the electrical connector according to the second embodiment of the present invention viewed from another angle.

As shown in FIGS. 7 and 8, the insulating body 1' is provided with multiple receiving slots 11' in a penetration manner, and the terminals 2' are correspondingly received in the receiving slots 11'. One side surface of each receiving slot 11' protrudes and extends to form a stopping portion 111' to stop upward and downward movement of the corresponding terminal 2' in the receiving slot 11', and the other side surface of the receiving slot 11' protrudes and extends toward the solder 3' to form a protruding block 112'. The protruding block 112' is flush with a lower surface of the insulating body 1'.

As shown in FIGS. 7, 8, 10 and 11, each terminal 2' has a positioning arm 21'. A protruding portion 211' is horizontally arranged at a tail end of the positioning arm 21' in a protrusion manner. A top surface of the protruding portion 211' forms a positioning surface 2111'. The positioning surface 2111' is positioned below the corresponding stopping portion 111' to limit upward movement of the corresponding terminal 2'. A soldering portion 22' is formed by upward tearing and perpendicular bending from the middle of a lower edge of the positioning arm 21', (in other embodiments, the soldering portion 22' can also be formed by tearing from a non-middle position of the lower edge of the positioning arm 21'). A notch 27' is formed in a tearing position of the positioning arm 21'. The protruding block 112' is positioned in the notch 27', and urges against the solder 3'. A lower surface of the soldering portion 22' forms a soldering surface 221' for being soldered to the solder 3'. A height of the positioning surface 2111' is between the soldering surface 221' and a lowest point 31' of the solder 3', so that the soldering surface 221' is high enough to reduce a height of the terminal 2'. Further, a laser irradiated region 2221' is arranged on an upper surface of the soldering portion 22'. The laser irradiated region 2221' can be irradiated by laser 6' to heat the soldering portion 22', and heat is transferred to the solder 3' through the soldering portion 22', so that the solder 3' is partially molten to be immobilized on the soldering surface 221', which avoid complete melting of the solder 3' and thus avoid influence of subsequent soldering of the solder 3' to the circuit board 5'.

A base 23' is formed by extending upward from each soldering portion 22'. A limiting portion 29' horizontally protrudes and extends from one side of the base 23', and is positioned above the stopping portion 111' to limit upward movement of the terminal 2'. Both the limiting portion 29' and the protruding portion 211' do not contact with two side surfaces of the receiving slot 11' along a horizontal direction, so that the insulating body 1' which is excessively thin can be prevented from being broken when being squeezed by stress of the terminal 2' in the horizontal direction. An elastic arm 28' is formed by bending upward and extending from the base 23'. The elastic arm 28' is connected with a contact portion 20' that urges upward the chip module 4'. Further, a horizontal projection of the elastic arm 28' is not overlapped with a horizontal projection of the laser irradiated region 2221'. The horizontal projection of the laser irradiated region 2221' is exposed in the receiving slot 11', so that the laser 6' can irradiate the laser irradiated region 2221' from top to bottom through the receiving hole 11'. In addition, the elastic arm 28' includes a first arm 24' formed by bending and extension in a direction away from a vertical plane where the base 23' is positioned, and a second arm 25' which returns from the first arm 24' to be bent and extend across the vertical plane where the base 23' is positioned. The contact portion 20' is formed at a top end of the second arm 25', and urges upward the chip module 4'. The first arm 24' and the soldering portion 22' are positioned on two opposite sides of the vertical plane where the base 23' is positioned to ensure stability of an overall structure of the terminal 2'.

A strip connecting portion 26' is formed by upward and vertical extension from a top end of the base 23', and is configured to connect a strip. A height of a top end of the strip connecting portion 26' is lower than a top end of the receiving slot 11'. The receiving hole 11' is provided with a stopping block 113'. The stopping block 113' only covers a part of the top end of the strip connecting portion 26', so that a connecting width of the strip and the strip connecting portion 26' is reduced, and the strip can be conveniently broken.

Figure 13:
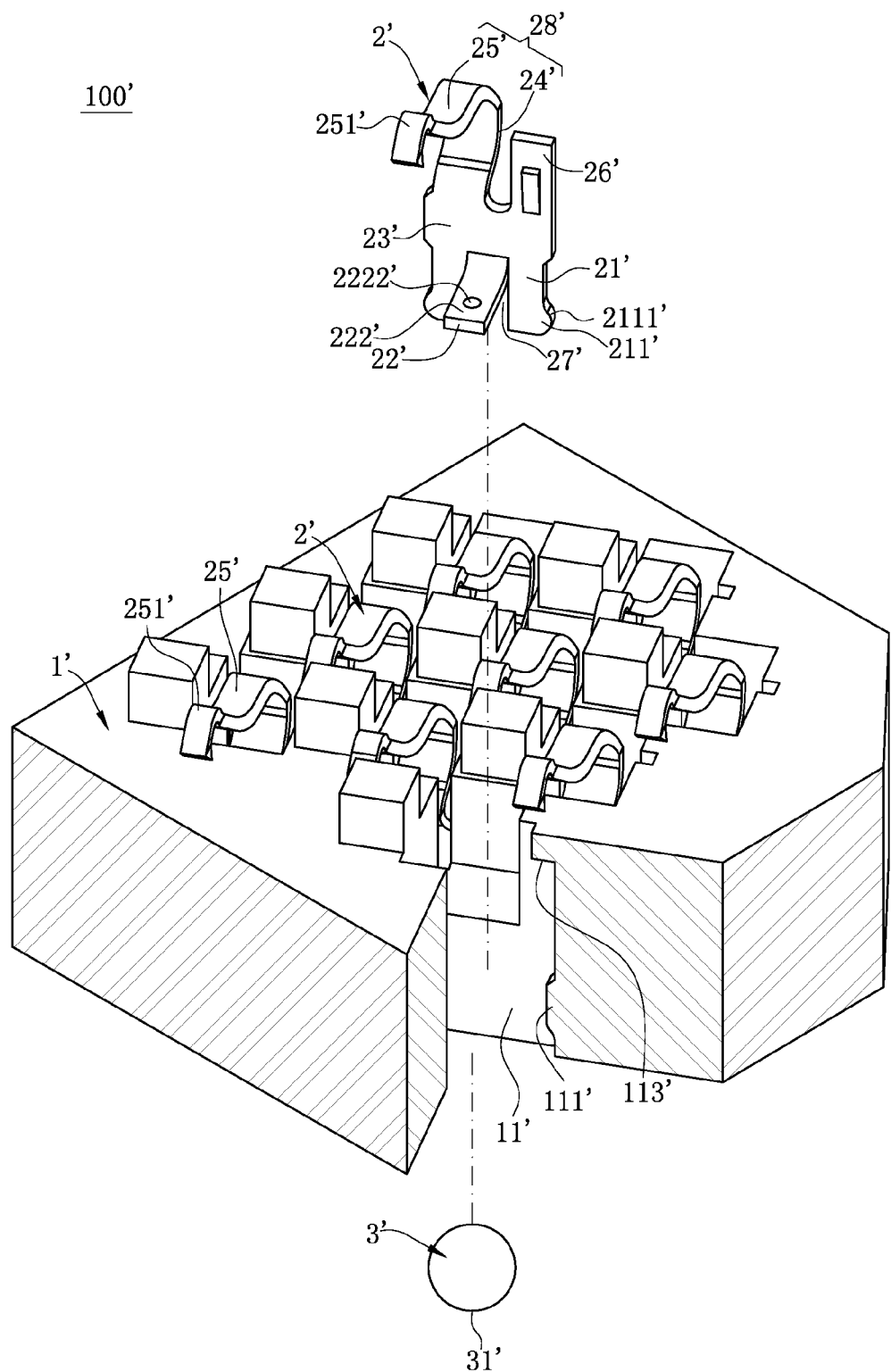
FIG. 13 is a schematic three-dimensional partial exploded view of an electrical connector according to of a third embodiment of the present invention.
Figure 14:
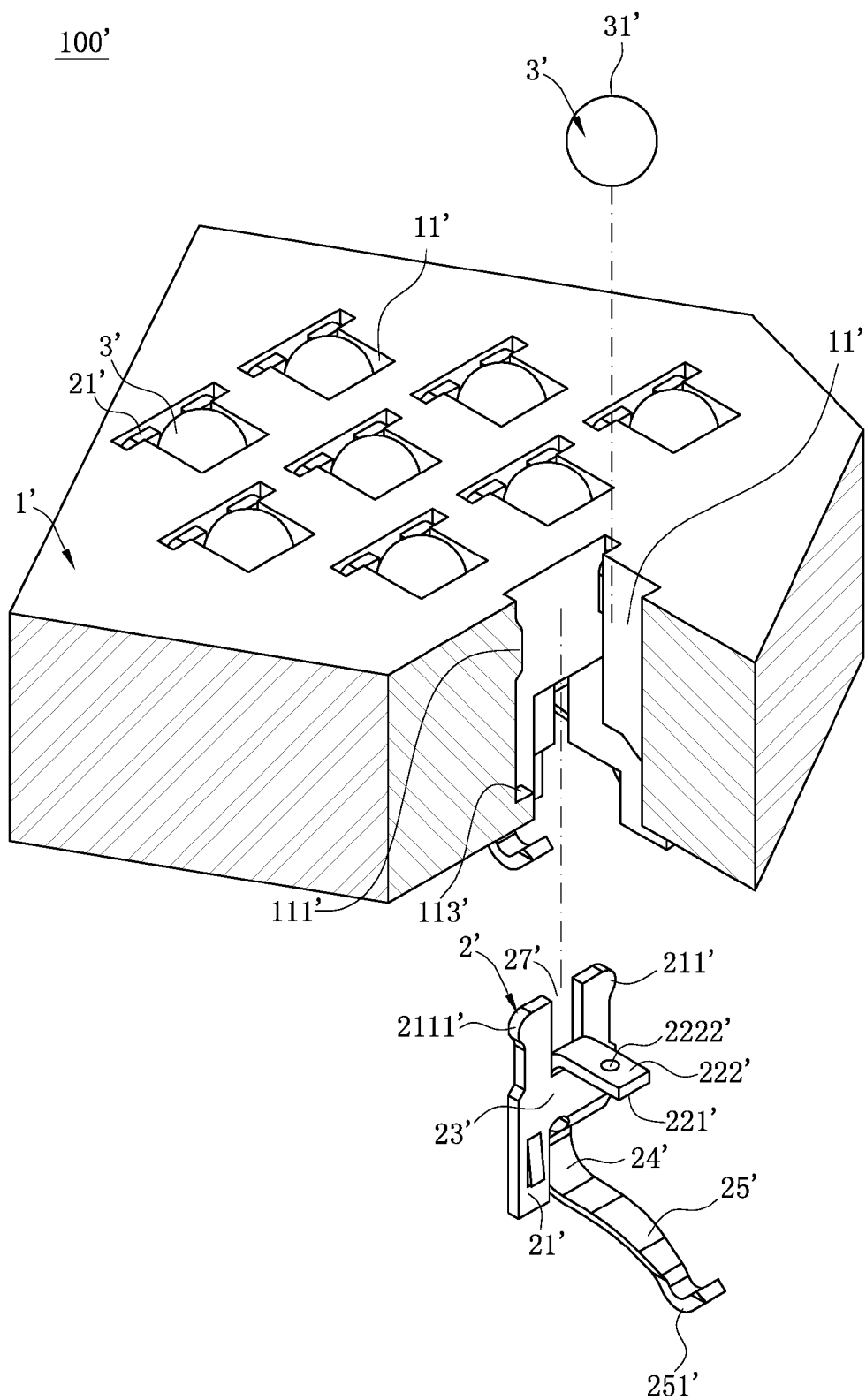
FIG. 14 is a schematic three-dimensional exploded view of the electrical connector according to the third embodiment of the present invention from another angle.
Figure 15:
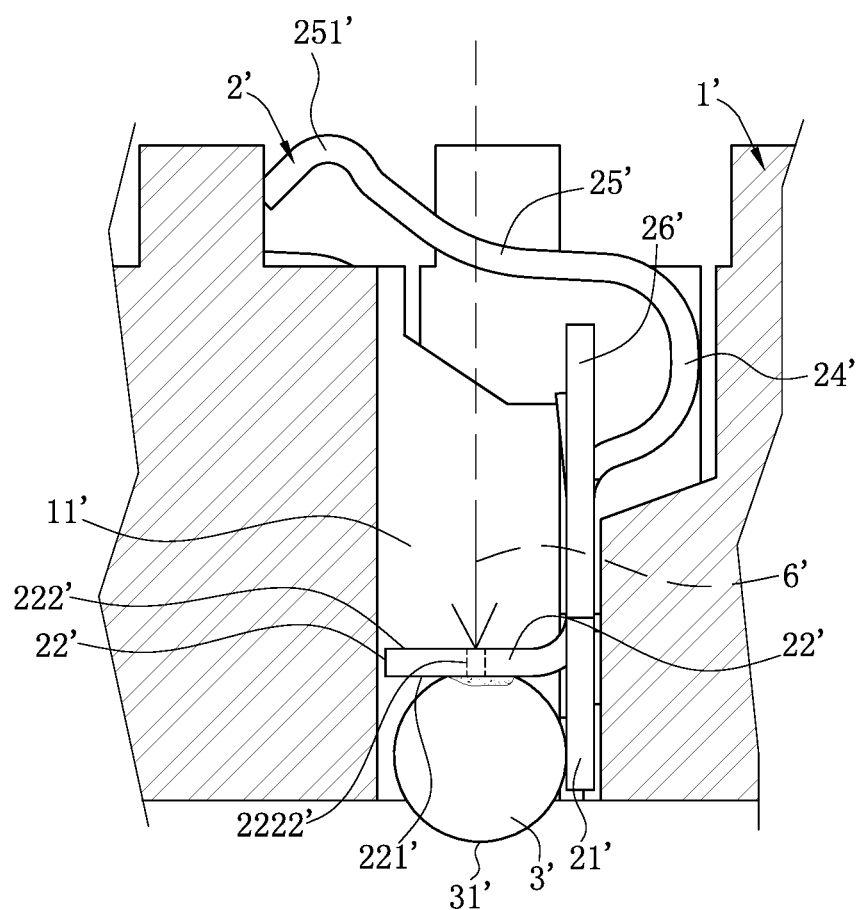
FIG. 15 is a partial sectional view of the electrical connector according to the third embodiment of the present invention.

FIGS. 13-15 show a third embodiment of an electrical connector 100' of the present invention. The third embodiment is different from the second embodiment in that: no protruding blocks 112' facing the solder 3' protrude and extend from the side surfaces of the receiving slots 11' to resist the solder 3', and the solder 3' directly urges the positioning arms 21' to avoid elastic movement of the positioning arms 21' and deflect and disable the stopping portions 111' in stopping. In addition, a back surface 222' is defined on the surface opposite to the soldering surface 221', of each soldering portion 22'. A through hole 2222' penetrates through the back surface 222' and the soldering surface 221'. The laser 6' penetrates through the through hole 2222' from the back surface 222' to irradiate the solder 3' to heat and melt the part, urging the soldering surface 221', of the solder 3' to be immobilized on the soldering surface 221' with the other part undamaged. Due to formation of the through hole 2222', the laser 6' can penetrate through the through hole 2222' to irradiate the solder 3' to increase a soldering speed. Similarly, in order to enable the laser 6' to irradiate the through hole 2222' from top to bottom through the receiving hole 11', the horizontal projection of the elastic arm 28' is not overlapped with a horizontal projection of the through hole 2222'. The horizontal projection of the through hole 2222' is exposed in the receiving hole 11'. The other structures and functions of the third embodiment are the same as those of the second embodiment, and will not be elaborated herein.

In an assembling process of the electrical connector 100' of the present invention, the terminals 2' are assembled in the receiving slots 11' at first from top to bottom, then the solder 3' is squeezed into the receiving holes 11' from bottom to top to urge the soldering surfaces 221', and the laser 6' finally irradiates the laser irradiated regions 2221' or the through holes 2222' from top to bottom through the receiving holes 11' to solder the solder 3' to the soldering portions 22'.

In summary, the electrical connector 100 according to certain embodiments of the present invention has the following beneficial advantages.

(1) The positioning surfaces 261 are lower than the soldering surfaces 241, and are stopped below the stopping portions 121, so that not only can it be ensured that the soldering surfaces 241 are high enough to receive the solder 3 in the receiving slots 11 to reduce the height of the electrical connector 100, but also it can be ensured that the positioning surfaces 261 are effectively stopped at the stopping portions 121, the retaining power of the receiving slots 11 for the terminals 2 is improved, the terminals 2 are prevented from excessively moving upwards during mounting of the solder 3 and the signal transmission stability of the electrical connector 100 is improved.

(2) The widths of the positioning arms 25 are gradually reduced from top to bottom from the protruding portions 251 to the barbs 26, so that the elasticity of the barbs 26 is further enhanced, the barbs 26 can be stopped at the stopping portions 121 better, and assembling of the terminals 2 is also facilitated.

(3) The limiting portions 27 downwards urge the lower surfaces 1111 of the limiting slots 111, so that the terminals 2 are prevented from being damaged by excessive downward movement of the terminals 2 during mounting.

(4) The limiting portions 27 and the protruding portions 251 are positioned in the same vertical plane, and stop the two opposite sidewalls of the receiving slots 11 respectively, so that the terminals 2 are prevented from excessively swinging leftwards and rightwards in the receiving slots 11.

(5) Neither the limiting portions 27 nor the protruding portions 251 contact with the side surfaces of the receiving slots 11' along the horizontal direction, so that the insulating body 1' which is excessively thin is prevented from being broken when being squeezed by the terminals 2' in the horizontal direction.

(6) The laser 6' can irradiate the laser irradiated regions 2221' from top to bottom through the receiving holes 11' to heat and melt the parts, urging the soldering surfaces 221', of the solder 3' to be fixed on the soldering surfaces 221' with the other part undamaged, so that smoothness of the solder 3' is ensured, and missing solder is avoided.

(7) The through holes 2222' penetrate through the soldering portions 22', so that the laser 6' can penetrate through the through holes 2222' to directly irradiate the solder 3' to increase the soldering speed.

(8) The protruding blocks 112' are positioned at the notches 27', so that the solder 3' can be positioned, the positioning arms 21' can also be stopped, and the positioning arms 21' can further be separated from the solder 3' to prevent the solder 3' from flowing onto the positioning arms 21' to cause influence on a soldering function when being soldered and molten.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector for electrically connecting a chip module to a circuit board, comprising:
   an insulating body for sustaining the chip module, wherein the insulating body has a plurality of receiving slots vertically running through the insulating body, and each of the receiving slots is provided with a stopping portion; and
   a plurality of terminals respectively received in the receiving slots,
   wherein each of the terminals has a contact portion for contact with the chip module, each of the terminals is provided with a soldering surface and a positioning surface that are separated, a solder urges against the soldering surface, the positioning surface is positioned below the stopping portion to limit upward movement of the terminal or the positioning surface is positioned above the stopping portion to limit downward movement of the terminal, and a height of the positioning surface is between the soldering surface and a lowest point of the solder.

2. The electrical connector of claim 1, wherein a limiting surface is arranged at each of the receiving slots to limit upward movement of the solder, and the stopping portion is flush with the limiting surface.

3. The electrical connector of claim 1, wherein a protruding block protrudes from each of two opposite sides of each receiving slot on an upper surface of the insulating body, and is configured to support the chip module, a reserved space is formed between every two adjacent protruding blocks, and each of the contact portions is positioned over corresponding one of the reserved spaces.

4. The electrical connector of claim 1,
   wherein each of the terminals further comprises a positioning arm and a base that are positioned in a same vertical plane, a protruding portion protrudes horizontally from a tail end of the positioning arm, and the positioning surface is formed on a top surface of the protruding portion, and is posited below the stopping portion;
   wherein an elastic arm is formed by bending upward and extending from a top end of the base, and is connected with the contact portion; and
   wherein a soldering portion is formed by extending from a bottom end of the base, and the soldering surface is a bottom surface of the soldering portion.

5. The electrical connector of claim 4, wherein each of the soldering portions is formed by bending and extending perpendicularly from the base, each of the elastic arms comprises a first arm bending from the top end of the base and extending toward a direction away from a vertical plane where the base is positioned, and a second arm returning from the first arm and bending and extending across the vertical plane where the base is positioned, the first arm and the soldering portion are positioned on the same side of the vertical plane where the base is positioned, and the second arm is connected with the contact portion.

6. The electrical connector of claim 4, wherein a clearance exists between the positioning arm and the solder.

7. The electrical connector of claim 4, wherein a protruding portion protrudes horizontally from one side of each of the positioning arms in a direction away from the base, a limiting portion protrudes horizontally and extends from one side of each of the bases in a direction away from the positioning arm, and the limiting portion and the protruding portion of each of the terminals are positioned in a same vertical plane.

8. The electrical connector of claim 7, wherein the limiting portions and the protruding portions do not contact with side surfaces of the receiving slots along a horizontal direction.

9. The electrical connector of claim 4, wherein each of the receiving slot is provided with a limiting slot, the limiting slot has a lower surface, a first side surface and a second side surface that are connected with the lower surface and are opposite to each other, and a third side surface connected with the first side surface and the second side surface, and the limiting portion is limited in the limiting slot.

10. The electrical connector of claim 9, wherein each of the limiting portions protrudes and extends from a joint of corresponding one of the bases and corresponding one of the elastic arms.

11. The electrical connector of claim 4, wherein each of the soldering portions is formed by tearing and bending from corresponding one of the positioning portions.

12. The electrical connector of claim 11, wherein each of the soldering portions is formed by upward tearing and bending from a middle of lower edge of corresponding one of the positioning arms.

13. The electrical connector of claim 12, wherein a notch is formed in a tearing position of each of the positioning arms by tearing, and the solder resists two opposite sides of the notch.

14. The electrical connector of claim 12, wherein a side surface of each of the receiving slots protrudes and extends towards the solder to form a protruding block, and the protruding block is positioned at the tearing position, and resists the solder.

15. The electrical connector of claim 1, wherein each of the terminals has a soldering portion, the soldering surface is formed at the soldering portion, the soldering portion is provided with a laser irradiated region on an opposite surface of the soldering surface, the laser irradiated region is irradiated by laser to heat the soldering portion, and heat is transferred to the solder through the soldering portion to partially melt and fix the solder on the soldering surface.

16. The electrical connector of claim 15, wherein a base is formed by upward extension from each of the soldering portions, an elastic arm is formed by upward bending and extension from the base, and is connected with the contact portion, a horizontal projection of the elastic arm is not overlapped with a horizontal projection of the laser irradiated region, and the horizontal projection of the laser irradiated region is exposed in the receiving slot.

17. The electrical connector of claim 16, wherein each of the elastic arms comprises a first arm formed by bending from a top end of the base and extension in a direction away from a vertical plane where the base is positioned, and a second arm which returns from the first arm to be bent and extend across the vertical plane where the base is positioned, the first arm and the soldering portion are positioned on two opposite sides of the vertical plane where the base is positioned, and the second arm is connected with the contact portion.

18. The electrical connector of claim 1, wherein each of the terminals has a soldering portion, the soldering surface is formed at the soldering portion, the soldering portion is defined with a back surface opposite to the soldering surface, a through hole penetrates through the back surface and the soldering surface, and laser penetrates through the through hole from the back surface to irradiate the solder to heat and melt a part of the solder that urges the soldering surface of the solder, to fix the solder on the soldering surface without damaging other part of the solder.

19. The electrical connector of claim 18, wherein a base is formed by upward extension from each of the soldering portions, an elastic arm is formed by upward bending and extension from the base, and is connected with the contact portion, and a horizontal projection of the elastic arm is not overlapped with a horizontal projection of the through hole; and the horizontal projection of the through hole is exposed in the receiving slot.

20. The electrical connector of claim 19, wherein each of the elastic arms comprises a first arm formed by bending from a top end of the base and extension in a direction far away from a vertical plane where the base is positioned, and a second arm which returns from the first arm to be bent and extend across the vertical plane where the base is positioned, the first arm and the soldering portion are positioned on two opposite sides of the vertical plane where the base is positioned, and the second arm is connected with the contact portion.

* * * * *